United States Patent

Huang

(10) Patent No.: US 7,830,287 B1
(45) Date of Patent: Nov. 9, 2010

(54) ANALOG TO DIGITAL CONVERTER HAVING DIGITAL CORRECTION LOGIC THAT UTILIZES A DITHER SIGNAL TO CORRECT A DIGITAL CODE

(75) Inventor: Chih-Haur Huang, Tainan County (TW)

(73) Assignee: Himax Media Solutions, Inc., Sinshih Township, Tainan County (TW)

( * ) Notice: Subject to any disclaimer, the term of this patent is extended or adjusted under 35 U.S.C. 154(b) by 18 days.

(21) Appl. No.: 12/437,676

(22) Filed: May 8, 2009

(51) Int. Cl.
*H03M 1/20* (2006.01)
(52) U.S. Cl. ..................... 341/131; 341/155
(58) Field of Classification Search .......... 341/130–155
See application file for complete search history.

(56) References Cited

U.S. PATENT DOCUMENTS

| | | | |
|---|---|---|---|
| 6,172,629 B1 * | 1/2001 | Fetterman .................. | 341/131 |
| 6,404,364 B1 * | 6/2002 | Fetterman et al. ........... | 341/131 |
| 6,548,611 B2 * | 4/2003 | Lai et al. .................... | 526/126 |
| 6,784,814 B1 * | 8/2004 | Nair et al. ................... | 341/118 |
| 7,129,874 B2 * | 10/2006 | Bjornsen .................... | 341/143 |
| 2009/0231174 A1 * | 9/2009 | Sutardja .................... | 341/122 |

* cited by examiner

*Primary Examiner*—Lam T Mai
(74) *Attorney, Agent, or Firm*—Thomas, Kayden, Horstemeyer & Risley

(57) ABSTRACT

An analog to digital converter is provided. The converter comprises a dither gain generator, a first stage, an adder, a second stage, and a digital error correction logic. The dither gain generator generates a dither gain. The first stage receives a first voltage to generate a first digital code and a second voltage. The adder is coupled to the first stage and adds the dither voltage to the second voltage to generate a third voltage. The second stage receives the third voltage to generate a second digital code. The digital error correction logic receives and corrects the first digital code and the second digital code to generate a digital code corresponding to the first voltage.

18 Claims, 5 Drawing Sheets

ANALOG TO DIGITAL CONVERTER HAVING DIGITAL CORRECTION LOGIC THAT UTILIZES A DITHER SIGNAL TO CORRECT A DIGITAL CODE

BACKGROUND OF THE INVENTION

1. Field of the Invention

The present invention relates to an analog to digital converter, and more particularly to an analog to digital converter having high linearity.

2. Description of the Related Art

Consumers increasingly rely on digital resources provided by electronic devices such as cellular telephones, digital cameras, or portable and handheld digital electronic devices. The electronic devices process and/or produce both digital and analog signals. Meanwhile, the demand for faster transmission of digital data is increasing, along with increasing demand for applications such as wireless networks, downloadable digital music devices, digital movie devices, and others.

Electronic devices require the receipt of analog signals, which are then converted to digital signals, referred to as analog to digital (A/D) conversion. The electronic devices include appropriate circuitry to perform the A/D conversion to perform digital signal processing.

The pipelined architecture for Analog-to-Digital Conversion (ADC) rely on the concept of simultaneous data subconversion in multiple stages in order to progressively refine the digital representation of an analog signal. There are two fundamental approaches to pipelined ADC: a switched-capacitor, and a switched-current approach. In both of the approaches, the ADC apparatus is negatively influenced when components employed during stages of the pipelined ADC are mismatched.

FIG. 3 is a schematic diagram showing an analog-to-digital conversion error in a conventional analog to digital converter. The vertical axis is the DNL (differential nonlinearity) value which is the difference between an actual output digital value and an ideal output digital value. The horizontal axis is the ideal output digital value. In FIG. 3, two peaks of the DNL value occur at the ideal output digital values 96 and 160. Thus, the output digital value is 97 and 161, not 96 and 160. The DNL peaks are generated due to capacitor mismatch, operation amplifier error or settling error in the analog to digital converter. Thus, performance and linearity of the analog to digital converter is decreased.

BRIEF SUMMARY OF THE INVENTION

An embodiment of an analog to digital converter is provided. The converter comprises a dither gain generator, a first stage, an adder, a second stage and a digital error correction logic. The dither gain generator generates a dither gain. The first stage receives a first voltage to generate a first digital code and a second voltage. The adder is coupled to the first stage and adds the dither voltage to the second voltage to generate a third voltage. The second stage receives the third voltage to generate a second digital code. The digital error correction logic receives and corrects the first digital code and the second digital code to generate a digital code corresponding to the first voltage.

Another embodiment of a video device is provided. The video device comprises an analog to digital converter and a display unit. The analog to digital converter converts a first analog signal to generate a digital signal. The display unit receives the digital signal to show a corresponding image.

The analog to digital converter further comprises a dither signal generator, a first stage, an adder, a second stage and a digital error correction logic. The dither signal generator generates a dither signal. The first stage receives a first analog signal to generate a first digital signal and a second analog signal. The adder is coupled to the first stage to add the dither signal to the second analog signal to generate a third analog signal. The second stage receives the third analog signal to generate a second digital signal. The digital error correction logic receives and corrects the first digital signal and the second digital signal to generate the digital signal.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
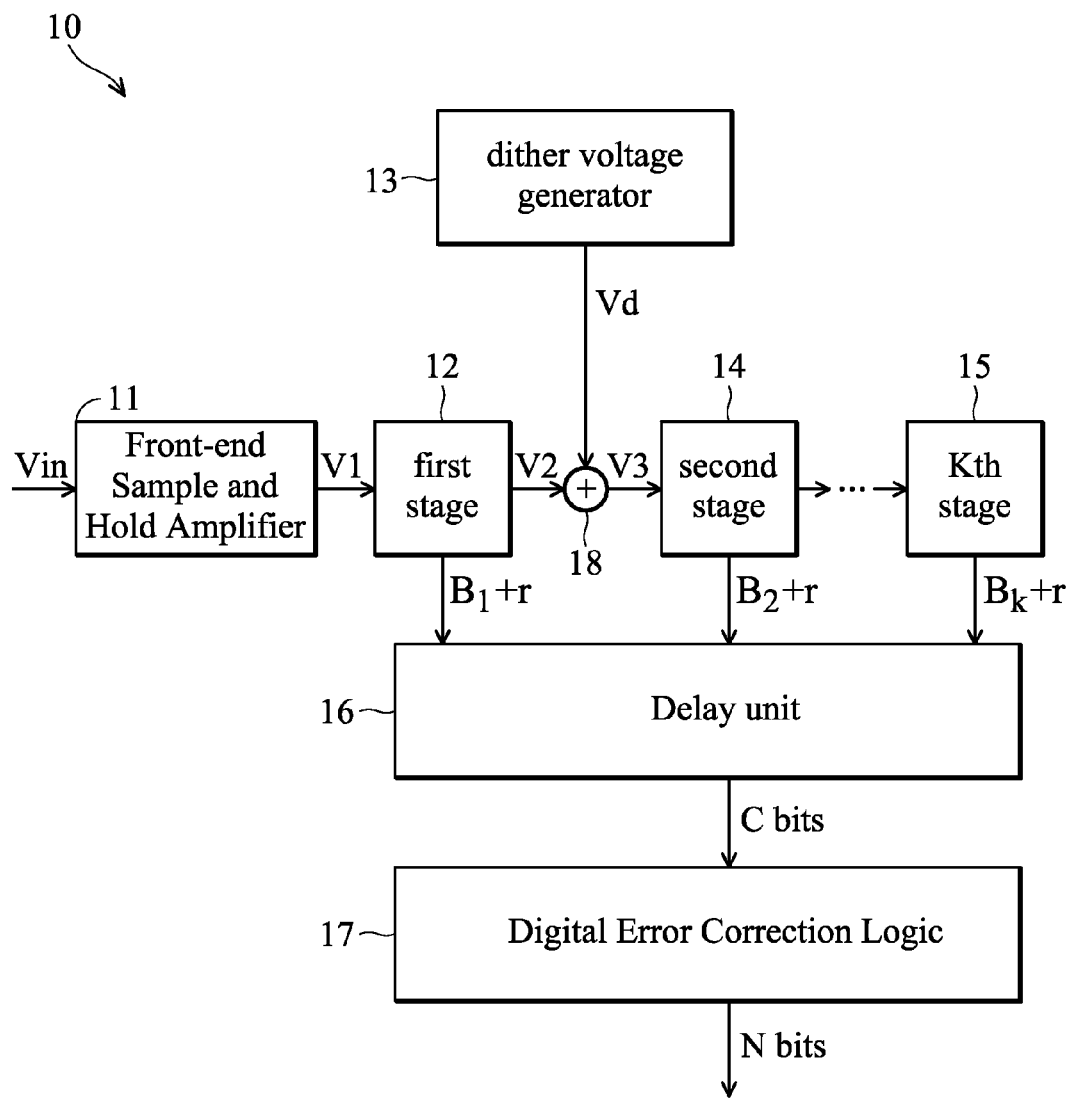
FIG. 1 is a block diagram of an embodiment of an analog to digital converter according to the invention.

FIG. 1 is a block diagram of an embodiment of an analog to digital converter according to the invention. The analog to digital converter 10 comprises a front-end sample and hold amplifier 11, a first stage 12, a dither voltage generator 13, a second stage 14, a $k^{th}$ stage 15, a delay unit 16, a digital error correction logic 17 and an adder 18. In this embodiment, the operation of each stage, such as the first stage 12, the second stage 14, or the $k^{th}$ stage 15, is substantially the same, and only the detailed operation of the first stage 12 and the second stage 14 is discussed here for brevity. Furthermore, the last stage, the $k^{th}$ stage 15, is a flash analog to digital converter.

By utilizing the dither voltage generator 13 and the adder 18, the linearity of the analog to digital converter 10 can be improved. Although, in FIG. 1, only one adder 18 is illustrated, however, the invention is not limited thereto. Those skilled in the art can add another adder and use a different amplitude of dither voltage to slightly calibrate the voltage input to other stages, and the linearity of the analog to digital converter 10 can be improved more efficiently.

The front-end sample and hold amplifier 11 receives, samples and amplifies the input voltage Vin to generate a first voltage V1. It is noted that the front-end sample and hold amplifier 11 may not amplify the voltage Vin, and only sample the input voltage Vin, and the amplitude of the input voltage Vin is the same as the first voltage V1. The first stage 12 receives the first voltage V1 to generate a second voltage V2 and a first digital code. The first digital code is shown $B_1$+r, wherein r indicates the error bit or redundant bit of the analog-to-digital conversion. In this embodiment, $B_1$ may be one bit value or a plurality of bit values according to the design of the first stage 12. The adder 18 adds the second voltage V2 and the dither voltage Vd to generate a third voltage V3. The dither voltage Vd is generated by the dither voltage generator 13. In one embodiment, amplitude of the dither voltage is between −0.5 LSB and 0.5 LSB, wherein the LSB indicates the smallest sensing voltage of the analog to digital converter 10. In the embodiment, the dither voltage is generated according to a random noise or a white noise. In another embodiment, the dither voltage Vd is time-varied.

The second stage 14 receives the third voltage V3 to generate a second digital code shown as $B_2$+r, and another voltage (not shown in FIG. 1). The $k^{th}$ stage 15 generates the $k^{th}$ digital code shown as $B_k$+r. The delay unit 16 receives the digital codes from the stages and output the digital codes at the same time. Assuming the processing time of one stage is T, the delay unit delays the first digital code for (k−1)T, the second digital code for (k−2)T, and so on. The delay unit combines the received digital codes to generate and transmit a C-bits digital code to the digital error correction logic 17. The digital error correction logic 17 removes the comparator offset error from the C-bits digital code to generate an N-bits digital code which corresponds the input voltage Vin, wherein the N-bits digital code is made up of the bits $B_1$ to $B_k$.

Figure 4:
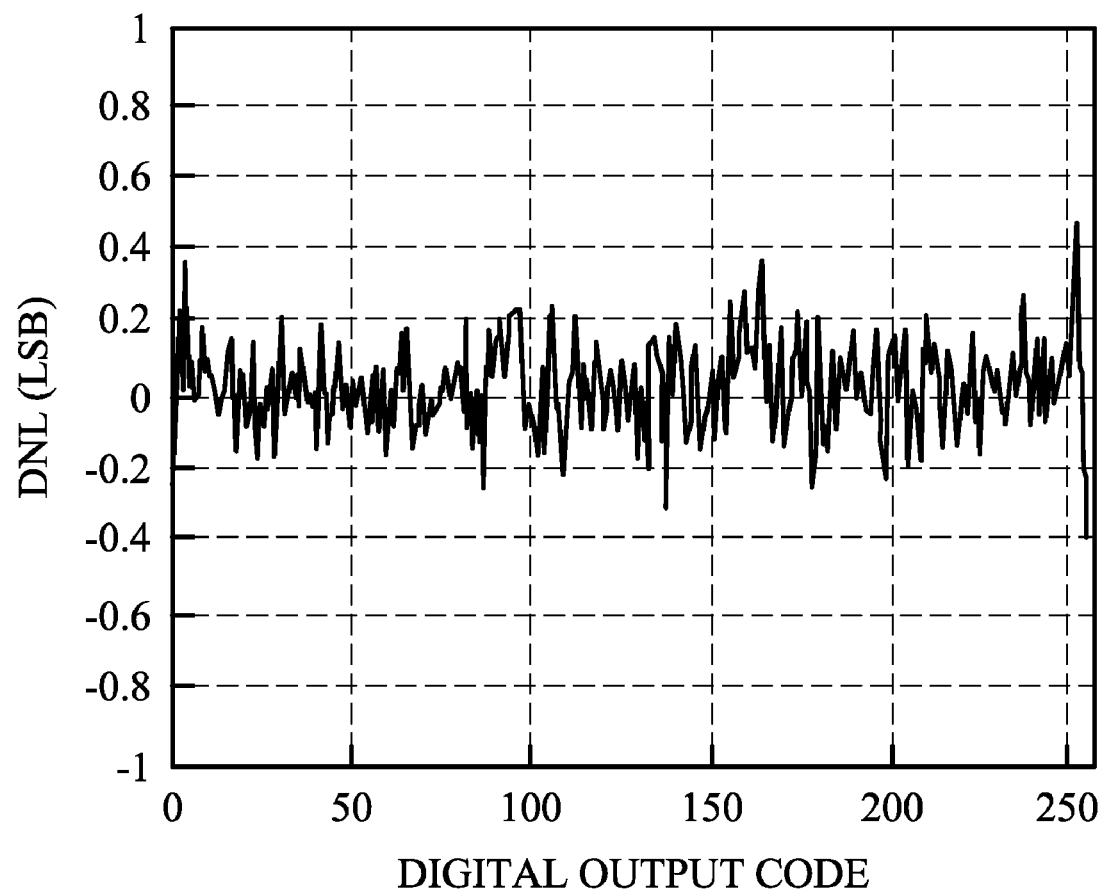
FIG. 4 is a schematic diagram showing the distribution of the DNL values of an embodiment of an analog to digital converter according to the invention.

Please refer to FIG. 4. FIG. 4 is a schematic diagram showing the distribution of the DNL values of an embodiment of an analog to digital converter according to the invention. Compared with FIG. 1, it is shown that the DNL peaks have been eliminated. By adding a dither voltage, the DNL values can be normally distributed, and accordingly the performance and the linearity of the analog to digital converter can be improved. Furthermore, the converted digital value corresponding to the input voltage Vin can be more accurate.

Figure 2:
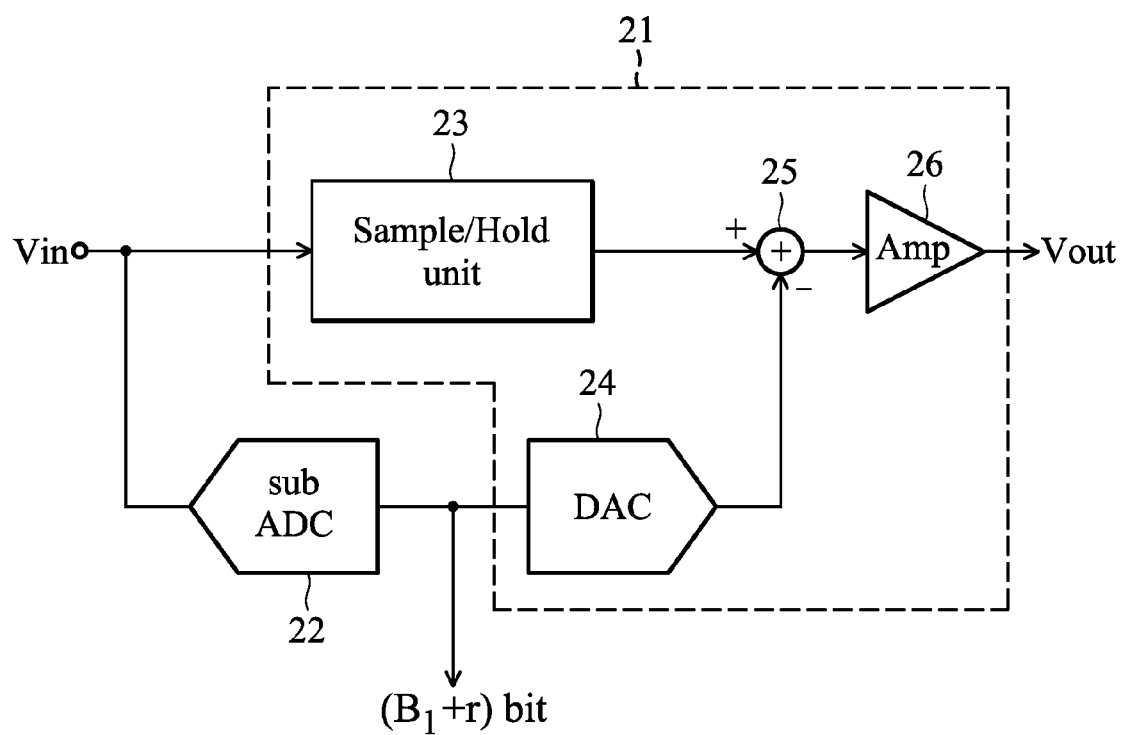
FIG. 2 is a block diagram of the first stage in FIG. 1 according to the invention.
Figure 3:
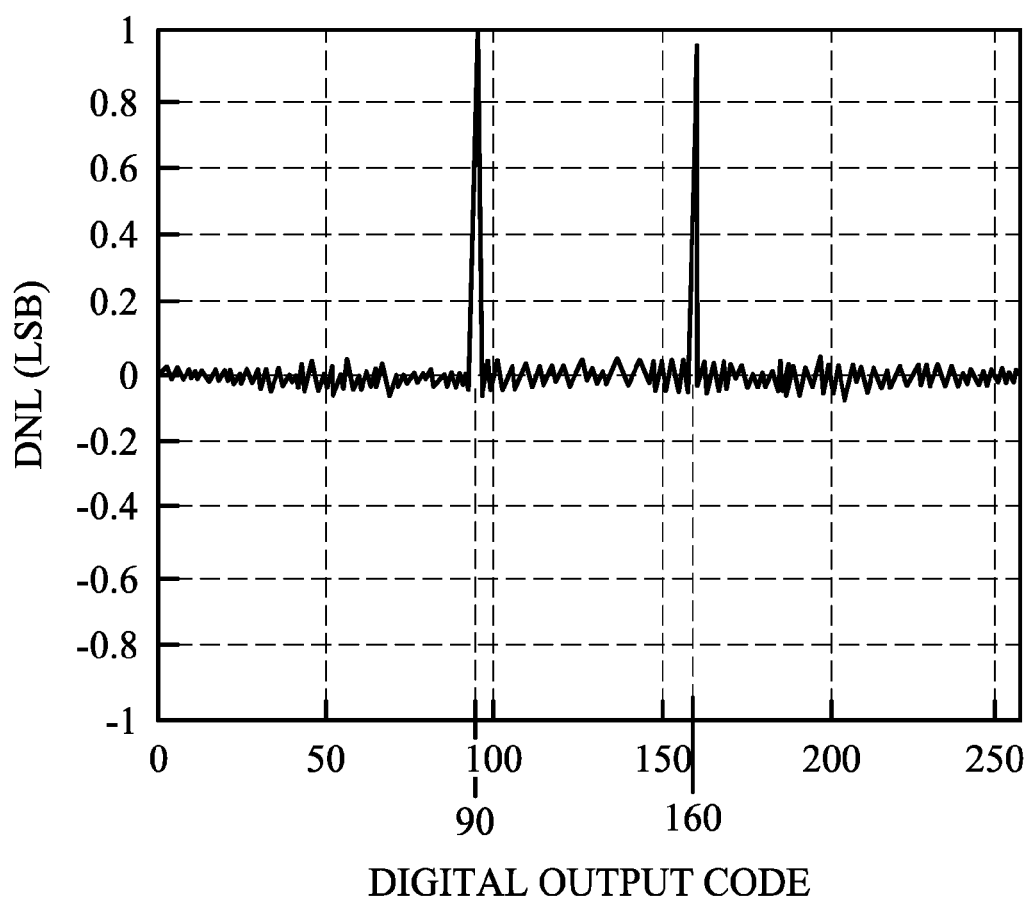
FIG. 3 is a schematic diagram showing an analog-to-digital conversion error in a conventional analog to digital converter.

FIG. 2 is a block diagram of the first stage in FIG. 1 according to the invention. It is noted that the other stages except the last stage, the $k^{th}$ stage 15, may also have the same architecture of FIG. 2. The first stage 12 comprises a multiplying digital-to-analog converter (MDAC) 21 and a sub analog-to-digital converter (ADC) 22. The sub ADC 22 receives the first voltage V1 and generates the first digital code. It is noted that the conversion by the sub ADC may cause comparator offset error, but the error can be removed by the digital error correction logic 17. The MDAC 21 receives the first voltage V1 and generates the second voltage V2 according to the first digital code. The MDAC 21 comprises a sample and hold unit 23 to hold the first voltage V1 for a predetermined time. The digital to analog converter (DAC) 24 generates voltage V1' according to the first digital code. The subtractor 25 subtracts the voltage V1' from the first voltage V1 to generate a voltage difference, Vd. The amplifier 26 then amplifies the voltage difference to generate the second voltage V2. The gain of the amplifier 26 is determined according the number of the bits of the first digital code. For example, if the first digital code comprises two bits, the gain of the amplifier 26 is also 2.

Figure 5:
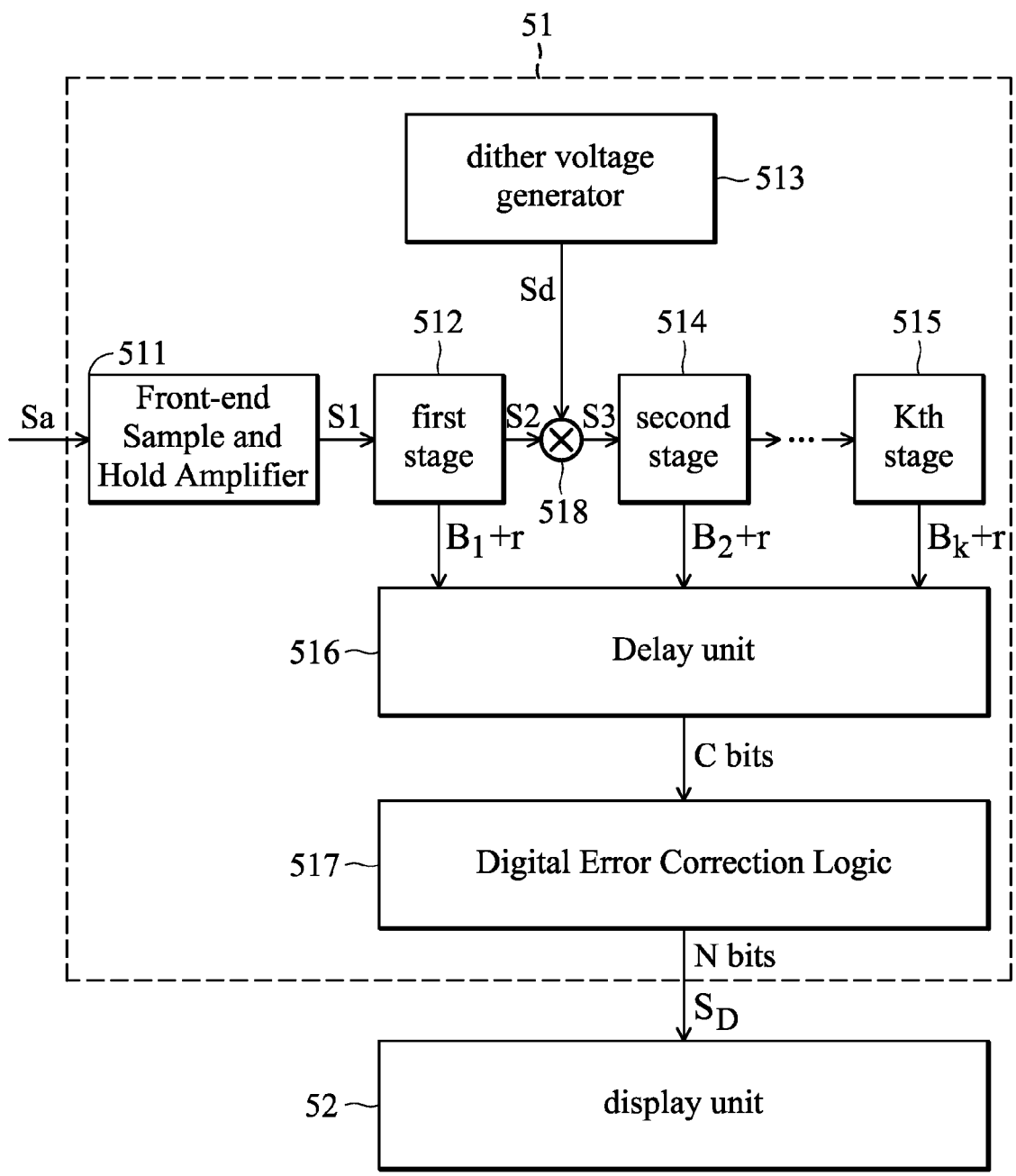
FIG. 5 is a schematic diagram of an embodiment of a video device according to the invention.

FIG. 5 is a schematic diagram of an embodiment of a video device according to the invention. The analog to digital converter 51 converts an analog signal $S_a$ to generate a digital signal $S_D$. The display unit 52 receives the digital signal $S_D$ to show a corresponding image. The analog to digital converter 51 comprises a front-end sample and hold amplifier 511, a first stage 512, a dither signal generator 513, a second stage 514, a $k^{th}$ stage 515, a delay unit 516, a digital error correction logic 517 and an adder 518. In this embodiment, the operation of each stage, such as the first stage 512, the second stage 514, or the $k^{th}$ stage 515, is substantially the same, and only the detailed operation of the first stage 512 and the second stage 514 is discussed here for brevity. Furthermore, the last stage, the $k^{th}$ stage 515, is a flash analog to digital converter.

By utilizing the dither signal generator 513 and the adder 518, the linearity of the analog to digital converter 51 can be improved. Although, in FIG. 5, only one adder 518 is illustrated, however, the invention is not limited thereto. Those skilled in the art can add another adder and use a different amplitude of dither signal to slightly calibrate the signal input to the next stages, and the linearity of the analog to digital converter 51 can be improved more efficiently.

The front-end sample and hold amplifier 511 receives, samples and amplifies the input analog signal $S_a$ to generate a first analog signal 51. It is noted that the front-end sample and hold amplifier 511 may not amplify the input analog signal $S_a$, and only sample the input analog signal $S_a$, and the amplitude of the input analog signal $S_a$ is the same as the first analog signal 51. The first stage 12 receives the first analog signal 51 to generate a second analog signal S2 and a first digital signal. The first digital signal is shown as $B_1$+r, wherein r indicates the error bit or redundant bit of the analog-to-digital conversion. In this embodiment, $B_1$ may be one bit or a plurality of bit according to the design of the first stage 512. The adder 518 adds the second analog signal S2 and the dither signal $S_d$ to generate a third analog signal S3. The dither signal $S_d$ is generated by the dither signal generator 513. In one embodiment, the amplitude of the dither signal $S_d$ is between −0.5 LSB and 0.5 LSB, wherein the LSB indicates the smallest sensing voltage of the analog to digital converter 51. In the embodiment, the dither signal $S_d$ is generated according to a random noise or a white noise. In another embodiment, the dither signal $S_d$ is time-varied.

The second stage 514 receives the third analog signal S3 to generate a second digital code shown as $B_2$+r, and another analog signal (not shown in FIG. 5). The $k^{th}$ stage 515 generates the $k^{th}$ digital code shown as $B_k$+r. The delay unit 516 receives the digital signals from the stages and outputs the digital signals at the same time. Assuming the processing time of one stage is T, the delay unit delays the first digital signal for (k−1)T, the second digital signal for (k−2)T, and so on. The delay unit 516 combines the received digital signals to generate and transmit a C-bits digital signal to the digital error correction logic 517. The digital error correction logic 517 removes the comparator offset error from the C-bits digital signal to generate the N-bits digital signal $S_D$ which corresponds the input analog signal $S_a$, wherein the N-bits digital signal $S_D$ is made up of the bits $B_1$ to $B_k$.

For detailed architecture of the first stage 512 or the second stage 514 reference can be made to the drawing and description of FIG. 2, and thus are not discussed here for brevity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog to digital converter, comprising:
   a dither voltage generator to generate a dither voltage;
   a first stage receiving a first voltage to generate a first digital code and a second voltage;
   an adder, coupled to the first stage, to add the dither voltage to the second voltage to generate a third voltage;

a second stage receiving the third voltage to generate a second digital code; and a digital error correction logic to receive and correct the first digital code and the second digital code to generate a digital code corresponding to the first voltage.

2. The converter as claimed in claim 1, further comprising:
a delay unit to receive and delay the first digital code for a preset time period, and transmit the first digital code and the second digital code to the digital error correction logic after receiving the second digital code.

3. The converter as claimed in claim 2, wherein the preset time period is determined based on a generation time of the second digital code of the second stage.

4. The converter as claimed in claim 1, further comprising:
a front-end sample and hold amplifier to receive and amply an input voltage to generate the first voltage.

5. The converter as claimed in claim 1, wherein the amplitude of the dither voltage is between −0.5 LSB and 0.5 LSB.

6. The converter as claimed in claim 1, wherein the dither voltage is generated according a white noise signal.

7. The converter as claimed in claim 5, wherein the dither voltage is a time-variable value.

8. The converter as claimed in claim 1, wherein the first stage comprising:
a sub analog to digital convert receiving the first voltage to generate the first digital code; and
a multiplying digital to analog converter to generate the second voltage.

9. The converter as claimed in claim 8, wherein the multiplying digital to analog converter further comprises:
a sub digital to analog converter receiving the first digital code to generate a fourth voltage;
a sample and hold unit to receive and output the first voltage;
a subtractor to subtract the fourth voltage from the first voltage to generate a voltage difference; and
an amplifier to amply the voltage difference to generate the second voltage.

10. A video device, comprising:
an analog to digital converter to convert a first analog signal to a digital signal, comprising:
a dither signal generator to generate a dither signal;
a first stage receiving a first analog signal to generate a first digital signal and a second analog signal;
an adder, coupled to the first stage, to add the dither signal to the second analog signal to generate a third analog signal;
a second stage receiving the third analog signal to generate a second digital signal; and
a digital error correction logic to receive and correct the first digital signal and the second digital signal to generate the digital signal; and
a display unit receiving the digital signal to show a corresponding frame.

11. The device as claimed in claim 10, further comprising:
a delay unit to receive and delay the first digital signal for a preset time period, and transmit the first digital signal and the second digital signal to the digital error correction logic after receiving the second digital signal.

12. The device as claimed in claim 10, wherein the preset time period is determined based on a generation time of the second digital signal of the second stage.

13. The device as claimed in claim 10, further comprising:
a front-end sample and hold amplifier to receive and amply an input signal to generate the first analog signal.

14. The device as claimed in claim 10, wherein the amplitude of the dither signal is between −0.5 LSB and 0.5 LSB.

15. The device as claimed in claim 10, wherein the dither signal is generated according a white noise signal.

16. The device as claimed in claim 10, wherein the first stage comprising:
a sub analog to digital convert receiving the first analog signal to generate the first digital code; and
a multiplying digital to analog converter to generate the second analog signal.

17. The device as claimed in claim 16, wherein the multiplying digital to analog converter further comprises:
a sub digital to analog converter receiving the first digital signal to generate a fourth analog signal;
a sample and hold unit to receive and output the first analog signal;
a subtractor to subtract the fourth analog signal from the first analog signal to generate a fifth analog signal; and
an amplifier to amply the fifth analog signal to generate the second analog signal.

18. The device as claimed in claim 17, wherein the amplitude of the amplifier is determined according to the number of bits of the first digital signal.

\* \* \* \* \*